United States Patent [19]
Masuda

[11] Patent Number: 5,726,579
[45] Date of Patent: Mar. 10, 1998

[54] DIFFERENTIAL CAPACITANCE DETECTOR

[75] Inventor: Takashi Masuda, Kanagawa-ken, Japan

[73] Assignee: Yamatake-Honeywell Co., Ltd., Tokyo, Japan

[21] Appl. No.: 518,176

[22] Filed: Aug. 23, 1995

[30] Foreign Application Priority Data

Aug. 25, 1994 [JP] Japan ................................. 6-200335

[51] Int. Cl.$^6$ ............................ G01R 27/26; G01N 27/22
[52] U.S. Cl. ............................................. 324/679; 324/658
[58] Field of Search .............................. 324/647, 649, 324/658, 676, 679

[56] References Cited

U.S. PATENT DOCUMENTS

| | | | |
|---|---|---|---|
| 3,753,373 | 8/1973 | Brown | 324/679 X |
| 3,757,210 | 9/1973 | Hansen et al. | 324/671 |
| 4,011,500 | 3/1977 | Pelletier et al. | 324/679 |
| 4,167,697 | 9/1979 | Gerber | 324/679 |
| 4,716,361 | 12/1987 | Sheffer | 324/679 |
| 5,073,757 | 12/1991 | George | 324/658 X |
| 5,317,274 | 5/1994 | Nakagawa et al. | 324/678 |
| 5,553,479 | 9/1996 | Rauchwerger | 324/679 X |

*Primary Examiner*—Glenn W. Brown
*Attorney, Agent, or Firm*—Lane, Aitken & McCann

[57] ABSTRACT

A differential capacitance detector comprises an integrator which has a difference between a capacitance ($C_S$) of a sensor having the capacitance corresponding to physical or chemical quantities of an object for detection and a reference capacitance ($C_R$) as constants, and an oscillation circuit which determines an oscillation frequency by the difference between the two capacitances ($C_S$ and $C_R$). The differential capacitance detector can detect or measure various kinds of physical or chemical quantities, even if the change of sensor capacitance is small.

9 Claims, 15 Drawing Sheets f (peak − to − peak) = 2.716Hz (0.05 % of the mean frequency)

$f_{mean}$ = 5.191kHz ( time distribution of oscillation frequency )

(A) Φ=1 and $\overline{\Phi}$=0

(B) Φ=0 and $\overline{\Phi}$=1

(A) Φ=1 and $\overline{\Phi}$=0

(B) Φ=0 and $\overline{\Phi}$=1

DIFFERENTIAL CAPACITANCE DETECTOR

BACKGROUND OF THE INVENTION

1. Field of the Invention

This invention relates to a detector for detecting or measuring amount of change of capacitance.

2. Prior Art

There is known a capacitive sensor which has been used as an apparatus for detecting or measuring various kinds of physical or chemical quantities such as pressure, humidity, temperature, displacement, flow rate, acceleration and so on, using change of capacitance. Also, an oscillation circuit has been used in many cases, as an interface circuit for generating a detection signal, which has the capacitive sensor as a frequency decision element.

If an oscillation frequency of the circuit is represented by $\omega$, a capacitance of the sensor is represented by $C$, and the amount of change of the capacitance is represented by $\Delta C$, then the oscillation frequency $\omega$ changes according to the capacitance $C$, and the rate of change is represented as follows:

The rate of change of the oscillation frequency $$= \frac{\omega(C + \Delta C) - \omega(C)}{\omega(C)} \times 100(\%) \quad (1)$$

The conventional oscillation circuit including the capacitive sensor is able to be smaller in size and lower in cost, because the oscillation circuit is constructed with a few of elements. However, the oscillation frequency ($\omega$) is decided by the whole capacitance ($C_S = C_B + \Delta$) of the sensor. Here, $C_B$ is a capacitance (base capacitance) at the time the sensor is in a reference state, and $\Delta C$ is the amount of change of the capacitance. Therefore, when the ratio of change ($\Delta C$) of capacitance to the whole capacitance ($C_S$) of the sensor is small, the amount of change of the oscillation frequency is also small. This makes a dynamic range of measurement of the capacitance narrow and the measurement with high accuracy difficult to achieve. Moreover, error factors such as parasitic capacitance, floating capacitance and the like cause problems.

More specifically, there are included a harmonic oscillation circuit and a relaxation oscillation circuit on the oscillation circuit as mentioned above.

First, the harmonic oscillation circuit is constructed by connecting an output $V_{OUT}$ to an input $V_{IN}$ in a state variable band-pass filter circuit illustrated in a block diagram of FIG. 13. As shown in FIG. 13, "21" indicates a first lag element (or leaky integrator)($-K_2$:gain) of an input signal, "22" indicates a first lag element (or leaky integrator)($K_1$:gain) of a feedback signal, and "23" indicates an integrator including a resistance $R$ and the sensor capacitance $C_S$. Here, "s" is a Laplace operator and "a" is a constant. $V_1$, $V_2$, and $V_3$ indicate voltages at the input $V_{IN}$, at an output of the integrator 23, and at the output $V_{OUT}$, respectively.

FIG. 14 shows a typical example of the harmonic oscillation circuit which is constructed by connecting an output $V_{OUT}$ to an input $V_{IN}$ in FIG. 13. In FIG. 14, a block 20 which includes the first lag elements 21, 22 and a summer ($\Sigma$) in FIG. 13, consists of a summing-leaky integrator 20A having resistances $R_{21}$, $R_{22}$, $R_{23}$, a capacitance C and an operational amplifier (Amp1), and an inverter 20B having resistances $R_{24}$, $R_{25}$ and an operational amplifier (Amp2). A block 23 consists of an integrator having a resistance R, a capacitance $C_S$ and an operational amplifier (Amp3).

A relation between an input and an output of the block 20 is represented as follows:

$$V_3 = \left( \frac{-\frac{1}{R_{21}C}}{s + \frac{1}{R_{23}C}} \right) V_1 + \left( \frac{-\frac{1}{R_{22}C}}{s + \frac{1}{R_{23}C}} \right) V_4 \quad (2)$$

$$= \left( \frac{-\frac{1}{R_{21}C}}{s + \frac{1}{R_{23}C}} \right) V_1 + \left( -\frac{R_5}{R_4} \right) \left( \frac{-\frac{1}{R_{22}C}}{s + \frac{1}{R_{23}C}} \right) V_2$$

Where $$K_2 = \frac{1}{R_{21}C}, K_1 = \frac{R_{25}}{R_{24}} \cdot \frac{1}{R_{22}C}, a = \frac{1}{R_{23}C},$$

the relation is represented by the transfer functions in FIG. 13 as follows:

$$V_3 = \frac{-K_2}{s + a} V_1 + \frac{K_1}{s + a} V_2 \quad (3)$$

By the way, the oscillation is a phenomenon in which oscillation signals are generated without existence of input signals, and a source of the phenomenon includes noises which flow from a power supply and noise sources in each element of the circuit. The noise sources in typical circuit elements are thermal noise, flicker noise and the like. These noises exist in a closed loop circuit in which the output $V_{OUT}$ of the circuit of FIG. 13 (an open circuit) is connected to the input $V_{IN}$. If the input and output of the open circuit are in even phase at a certain frequency and the gain is more than "1", the noise corresponding to the frequency signal is amplified and grows in the closed loop circuit. If the gain is more than "1", the oscillation signal will be saturated (or clipped) at a limited voltage of power source, and thus become a square wave signal.

The oscillation frequency $\omega$ of the harmonic oscillation circuit is given as follows:

First, an open loop voltage transfer function of the circuit of FIG. 13 is given by $$G(s) = \frac{V_{OUT}}{V_{IN}} = \frac{-sK_2}{s^2 + sa + \frac{K_1}{RC_S}} \quad (4)$$

From the above transfer function, the frequency at which the input and the output are in even phase is given as follows:

$$\theta = \tan^{-1} \frac{Im(G(j\omega))}{Re(G(j\omega))} = 0 \quad (5)$$

In this equation, when the imaginary part is zero, that is, $Im(G(j\omega))=0$, a phase characteristic can be of even phase. By the equation (4), a frequency-voltage transfer function is given by $$G(j\omega) = \frac{-j\omega K_2 \left( -\omega^2 + \frac{K_1}{RC_S} \right) - \omega^2 a K_2}{\left( -\omega^2 + \frac{K_1}{RC_S} \right)^2 + \omega^2 a^2} \quad (6)$$

Therefore, a condition that the imaginary part of this transfer function=0 is given as follows:

$$-\omega^2 + \frac{K_1}{RC_S} = 0 \quad (7)$$

$$\therefore \omega = \sqrt{\frac{K_1}{RC_S}} \quad (8)$$

Since $K_1$ and R are constants in the above equation, the oscillation frequency $\omega$ is determined by the sensor capacitance $C_S$.

In the circuit of FIG. 13, if $\Delta C = \alpha C_B$ ($\alpha$: rate of change of the capacitance), then the rate of change of the oscillation frequency $\omega$ for the change ($\Delta C$) of the capacitance is represented as follows:

The rate of change of the oscillation frequency $$= \left( \sqrt{\frac{1}{1+\alpha}} - 1 \right) \times 100 (\%) \quad (9)$$

From this equation, if the rate $\alpha$ of the sensor capacitance is small, then a dynamic range of measurement of the capacitance will also be narrow and it is difficult to obtain the high accuracy.

Next, the relaxation oscillation circuit is constructed as shown in FIG. 15. Here, R is a resistance and $C_S$ is the sensor capacitance. "31" indicates an operational amplifier, "32" and "33" indicate comparators, "34" indicates an S-R flip-flop, "35" and "36" indicate analog switches which are respectively actuated by a "Q" output and an "inversion Q" output of the flip-flop 34. One of two terminals of each analog switch 35, 36 is connected with the resistance R on an input side of the operational amplifier 31, and to the other terminals are applied predetermined reference voltages $V_R^+$ and $V_R^-$, respectively. The relaxation oscillation circuit is actuated as follows:

1. Initially (when a power supply is turned on), the output (Q) of the S-R flip-flop 34 certainly turns "1" or "0". Here, it is assumed that Q=1 initially for explanation of the operation.

2. When Q=1, the upper switch 35 turns ON (the lower switch 36 turns OFF), and current flows from the reference voltage ($V_R^+$) via the resistance (R) to the sensor capacitor ($C_S$). If a value of the current at this time is represented by $I_1$, then $$I_1 = V_R^+ / R \quad (10)$$

Accordingly, the output voltage of the operational amplifier 31 changes with a negative inclination.

3. When an output of the operational amplifier 31 becomes slightly lower in electric potential than the reference voltage ($V_R^-$), the lower comparator 33 outputs "1". Then, since a non-inversion (+ side) input signal of the upper comparator 32 is not more than the reference voltage ($V_R^+$), the upper comparator 32 outputs "0".

4. The S-R flip-flop 34 receives the "0" signal from the upper comparator 32 and the "1" signal from the lower comparator 33, then inverts the output (Q) (thus Q=0).

5. By the output of the S-R flip-flop 34, the upper switch 35 turns OFF (the lower switch 36 turns ON), then the current flows from the reference voltage ($V_R^-$) via the resistance (R) to the sensor capacitance ($C_S$). If a value of the current at this time is $I_2$, then $$I_2 = V_R^- / R \quad (11)$$

Accordingly, the output voltage of the operational amplifier 31 changes with a positive inclination.

6. When the output of the operational amplifier 31 becomes slightly higher in electric potential than the reference voltage ($V_R^+$), the upper comparator 32 outputs "1". Then, since an inversion ("−" side) input signal of the lower comparator 33 is not less than the reference voltage ($V_R^-$), the lower comparator 33 outputs "0".

7. The S-R flip-flop 34 receives the "0" signal from the lower comparator 33 and the "1" signal from the upper comparator 32, then inverts output (Q) (thus Q=1).

8. By repeating the above process after the step 2, the oscillation signal is outputted.

By the above process, the output of the operational amplifier 31 forms a triangular wave between the two reference voltages $V_R^+$ and $V_R^-$.

Here, if the time period when the output of the S-R flip-flop 34 is "1" (time interval of a negatively inclined portion of the triangular wave) is $T_1$, and the time period when the output of the S-R flip-flop 34 is "0" (time interval of positively inclined portion of the triangular wave) is $T_2$, then $$I_1 T_1 = C_S (V_R^+ - V_R^-)$$

$$I_2 T_2 = C_S (V_R^- - V_R^+)$$

Therefore, if these equations are substituted by the equations (10) and (11), $T_1$ and $T_2$ are given by $$T_1 = \frac{RC_S(V_R^+ - V_R^-)}{V_R^+} \quad (12)$$

$$T_2 = \frac{RC_S(V_R^- - V_R^+)}{V_R^-} \quad (13)$$

Accordingly, the time of one period of the oscillation is represented as follows:

$$T_1 + T_2 = \frac{RC_S(V_R^+ - V_R^-)}{V_R^+} + \frac{RC_S(V_R^- - V_R^+)}{V_R^-} \quad (14)$$

Therefore, the oscillation frequency f is given by $$f = \frac{1}{T_1 + T_2} = \frac{V_R^+ V_R^-}{RC_S(V_R^+ - V_R^-)(V_R^- - V_R^+)} \quad (15)$$

Accordingly, the oscillation frequency $\omega$ of the relaxation oscillation circuit is represented as follows:

$$\omega = \frac{-2\pi V_R^+ V_R^-}{RC_S(V_R^+ - V_R^-)^2} \quad (16)$$

If the reference voltage is set as $V_R^+ = -V_R^-$ and $|V_R^+| = V_R$, then $$\omega = \frac{\pi}{2RC_S} \quad (17)$$

Therefore, the oscillation frequency $\omega$ is determined by the sensor capacitance ($C_S$).

In the circuit of FIG. 15, if $\Delta C = \alpha C_B$ ($\alpha$: rate of change of the capacitance), the rate of change of the oscillation frequency for change ($\Delta C$) of the capacitance is represented as follows:

The rate of change of the oscillation frequency $$= \left( \frac{1}{1+\alpha} - 1 \right) \times 100(\%) \quad (18)$$

From this equation, when the rate $\alpha$ of the sensor capacitance is small, the dynamic range of measurement of the capacitance is narrow and the measurement with high accuracy is difficult to achieve.

SUMMARY OF THE INVENTION

It is an object of the present invention to provide an apparatus which solves problems of the conventional oscillation circuit including the capacitance type sensor, and which is able to detect or measure various kinds of physical or chemical quantities with high accuracy, even if the change of sensor capacitance is small.

A differential capacitance detector of this invention comprises an integrator (referred to as "differential capacitance inversion integrator") which has a difference between a capacitance ($C_S$) of a sensor having the capacitance corresponding to physical or chemical quantities of an object for detection and a reference capacitance ($C_R$) as constants; and an oscillation circuit which determines an oscillation frequency by the difference between the two capacitances ($C_S$ and $C_R$).

In the differential capacitance detector according to an embodiment of the invention, the sensor consists of a sensor referred to as "differential capacitance variable type sensor" having two capacitances and constructed such that one ($C_S^+$) of the capacitances increases and the other capacitance ($C_S^-$) decreases when the physical or chemical quantities of the object for detection are inputted. The differential capacitance detector takes the increasing capacitance ($C_S^+$) as the whole capacitance ($C_S$) of the sensor and takes the decreasing capacitance ($C_S^-$) as the reference capacitance ($C_R$).

The differential capacitance detector according to the other embodiment includes a second reference capacitance ($C_C$) and two analog switches for each of the two capacitances ($C_S$ and $C_R$) of the differential capacitance inversion integrator, generates two kinds of oscillation outputs from the oscillation circuit according to switch signals from the analog switches. The differential capacitance detector provides the two kinds of the oscillation outputs in a digital signal processing circuit, and thus detects a ratio of frequency of the oscillation outputs corresponding to the difference of the two capacitances (such detection is hereinafter referred to as "ratio-metric conversion" or "ratio metrics").

In the embodiment, the digital signal processing circuit consists of a circuit which digitizes an input signal and executes frequency-time conversion of the input signal.

According to the embodiment of the invention, the differential capacitance variable type sensor is assembled into the above-mentioned harmonic oscillation circuit or relaxation oscillation circuit so as to construct the oscillation circuit which decides the oscillation frequency by the two differential capacitances. That is, in the differential capacitance detector of this invention, the oscillation circuit consists of the harmonic oscillation circuit which includes the differential capacitance inversion integrator as an integrator, or the relaxation oscillation circuit employing the differential capacitance inversion integrator.

According to this invention, the oscillation frequency is determined by the two differential capacitances, because of employing the differential capacitance inversion integrator. Therefore, even if the change of the sensor capacitance is small, it is possible to attain detection or measurement of various kinds of physical or chemical quantities from the difference between the two capacitances with high accuracy and high resolution. Particularly, if a small change of the capacitance is measured, since the resolution is a main factor which influences synthetic accuracy finally, the high resolution is important.

Moreover, when the ratio-metric type differential capacitance inversion integrator is used, all of characteristics of the differential capacitance inversion integrator are obtained. In addition, it is possible to remove error factors such as drifts, temperature characteristic or deterioration, dependency on an electrical power source voltage and the like, of the circuit construction elements except the sensor capacitance ($C_S$), the reference capacitance ($C_R$), the second reference capacitance ($C_C$), and the gain (–k) of an inversion amplifier.

DETAILED DESCRIPTION OF PREFFERED EMBODIMENTS

First, notations showing capacitances for explanation are defined as follows:

$C_S$: sensor capacitance ($C_S=C_B+\Delta C$)

$C_B$: capacitance when the sensor is in a reference state (base capacitance)

$C_R$: reference capacitance $C_C$: second reference capacitance $C_S^+$: capacitance of a capacitor increasing in the differential capacitance variable type sensor ($C_S^+=C_B+\Delta C$)

$C_S^-$: capacitance of a capacitor decreasing in the differential capacitance variable type sensor ($C_S^-=C_B-\Delta C$)

Figure 1:
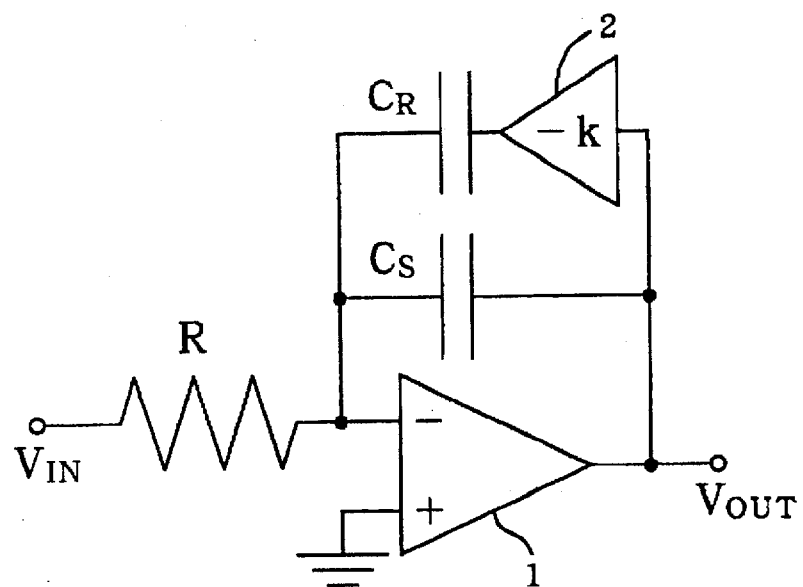
FIG. 1 is a circuit diagram of the differential capacitance inversion integrator included in the embodiment of the invention.

$\Delta C$: amount of change of the sensor capacitance from the base capacitance First, FIG. 1 shows a differential capacitance inversion integrator employed in this invention. It consists of an operational amplifier 1 which has a grounded input terminal of (+) side and another input terminal of (−) side connected to a resistance R, the sensor capacitance $C_S$, and the reference capacitance $C_R$ series connected to an inversion amplifier 2 (gain=−k). The capacitances $C_S$ and $C_R$ are connected in parallel as feedback elements between an output terminal and the input terminal of (−) side of the operational amplifier 1. In this construction, the circuit of FIG. 1 is an integrator which has a difference ($C_S$−$kC_R$) between the reference capacitance $C_R$ and the sensor capacitance $C_S$ as constant.

Figure 2:
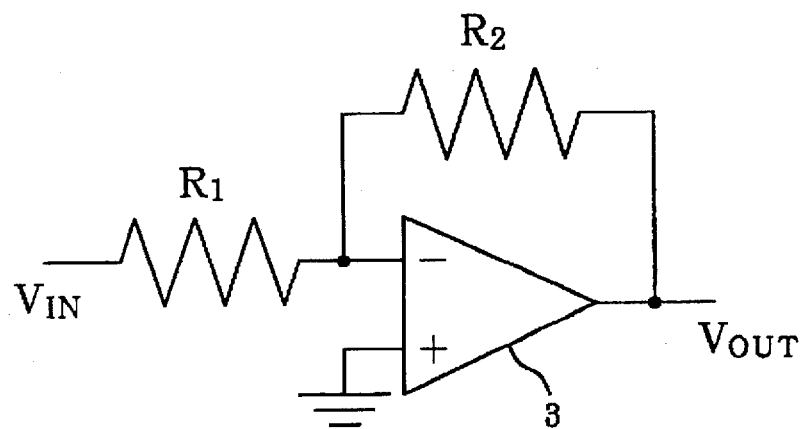
FIG. 2 is a circuit diagram of the inversion amplifier employed in the differential capacitance inversion integrator of FIG. 1.

The inversion amplifier 2 employed in the integrator of FIG. 1, as shown in FIG. 2, consists of an operational amplifier 3 which has a grounded input terminal of (+) side and another input terminal of (−) side connected to a resistance $R_1$, and a second resistance $R_2$ which is connected as a feedback element between an output terminal and the input terminal of (−) side of the operational amplifier 3. According to this construction, the gain (−k) of the inversion amplifier 2 of FIG. 1 equals −$R_2/R_1$.

The voltage transfer function of the differential capacitance inversion integrator of FIG. 1 is given by $$G(s) = \frac{-1}{sR(C_S - kC_R)} \quad (19)$$

where R ($C_S$−$kC_R$) is the integral constant of the differential capacitance inversion integrator shown in FIG. 1.

It is necessary that $C_S$>$kC_R$ for the integrator to operate as the differential capacitance inversion integrator.

According to the above-mentioned differential capacitance inversion integrator, since one side of each of the two capacitances ($C_S$ and $C_R$) is connected to a common line, it is possible to take out signals in three lines and it is easy to take out signals from the sensor (capacitance $C_S$).

Moreover, the influences of the parasitic capacitance and floating capacitance as mentioned above can be reduced by a common mode rejection effect by detecting the change of difference of capacitance, and an effect of shielding in a GND (ground) pattern of almost the same potential with a virtual GND to which the common line is connected.

When the reference capacitance $C_R$ differs largely from the base capacitance ($C_B$) of the sensor for any reason, the reference capacitance $C_R$ can be regulated by changing the gain (−k) of the inversion amplifier 2 so as to be $kC_R \approx C_B$.

In addition, an offset oscillation frequency (oscillation frequency when the sensor capacitance is the base capacitance $C_B$) can be changed by regulating the gain (−k) of the inversion amplifier 2.

Figure 3:
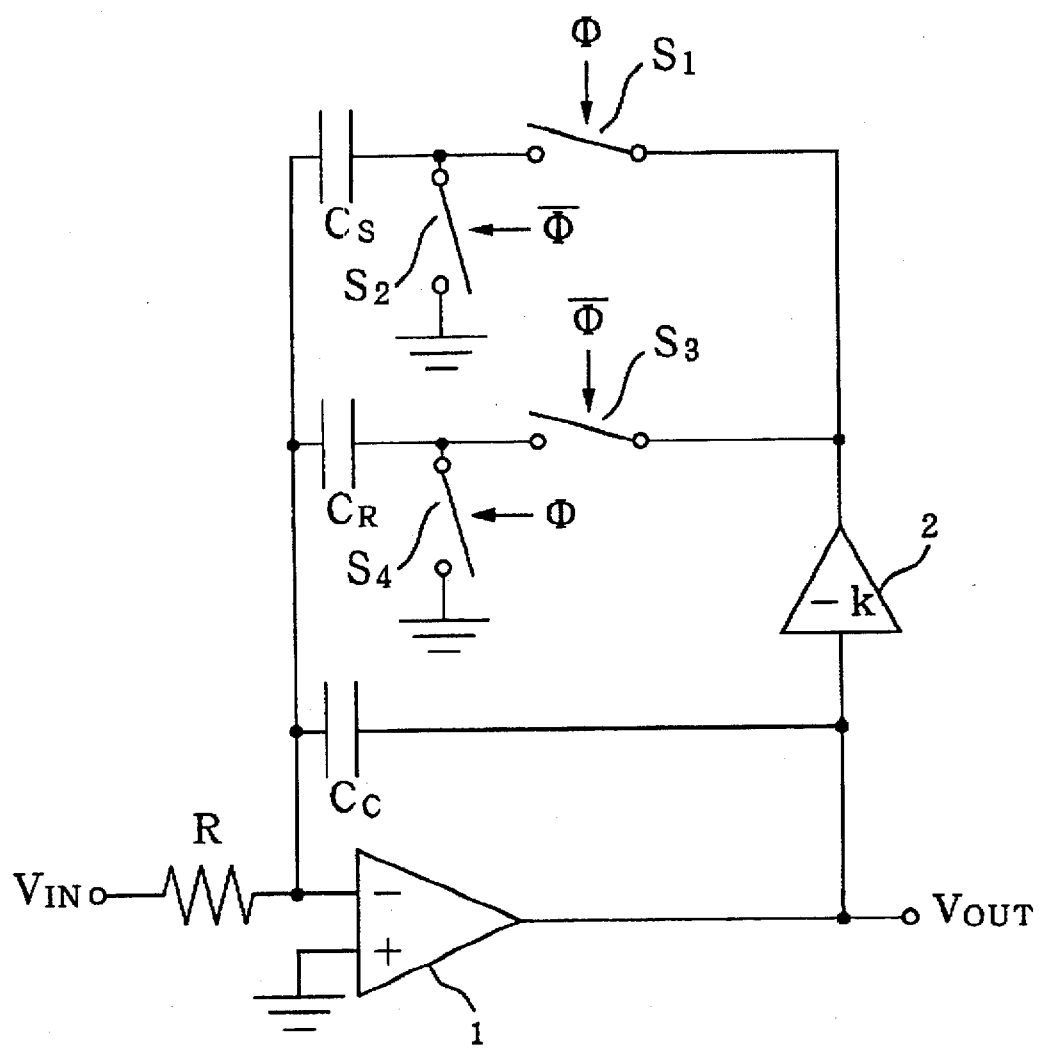
FIG. 3 is a circuit diagram of the ratio-metric type differential capacitance inversion integrator.

Next, FIG. 3 shows a ratio-metric type differential capacitance inversion integrator which is constructed so as to remove error factors such as drift, temperature characteristic or deterioration, dependency on the power source voltage and the like of the circuit construction elements in the differential capacitance inversion integrator of FIG. 1.

In order to remove such drift factors as the temperature characteristic or the deterioration of the circuit construction elements except the sensor capacitance ($C_S$), the reference capacitance ($C_R$), and the gain (−k) of the inversion amplifier 2 of the differential capacitance inversion integrator of FIG. 1, the ratio-metric type differential capacitance inversion integrator has two analog switches $S_1$, $S_2$ and $S_3$, $S_4$, respectively, connected for the sensor capacitance $C_S$ and the reference capacitance $C_R$ as shown in FIG. 3, and has an additional second reference capacitance $C_C$ to be ratio-metric.

As for the voltage transfer characteristic of the ratio-metric type differential capacitance inversion integrator, two kinds of transfer functions are given by switch signals (ø, inversion ø) for each of the analog switches $S_1$, $S_2$, $S_3$ and $S_4$ as follows:

When ø=1 and $\bar{ø}$=0, $$G_1(s) = \frac{-1}{sR(C_C - kC_S)} \quad (20)$$

When ø=0 and $\bar{ø}$=1, $$G_2(s) = \frac{-1}{sR(C_C - kC_R)} \quad (21)$$

It is necessary to be $C_S$>$kC_R$ and $C_C$>$kC_R$ for the circuit of FIG. 3 to operate as the differential capacitance inversion integrator.

Figure 4:
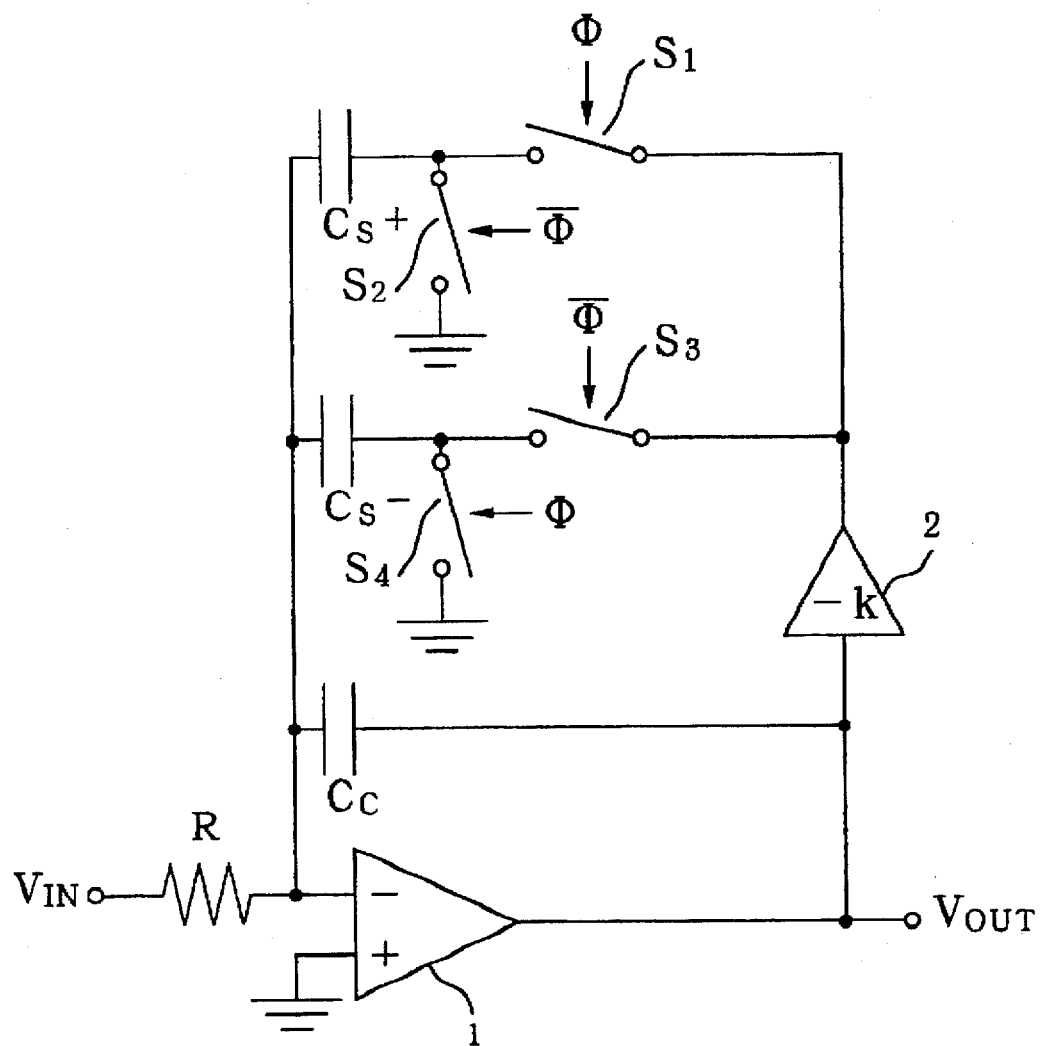
FIG. 4 is a circuit diagram of the ratio-metric type differential capacitance inversion integrator employing the differential capacitance variable type sensor.

FIG. 4 shows the ratio-metric type differential capacitance inversion integrator employed the differential capacitance variable type sensor having two capacitances $C_S^+$ and $C_S^-$.

As for the voltage transfer characteristic of the circuit, two kinds of transfer functions are given by switch signals (ø, inversion ø) for each of the analog switches $S_1$, $S_2$, $S_3$ and $S_4$ as follows:

When ø=1 and $\bar{ø}$=0, $$G_1(s) = \frac{-1}{sR(C_C - kC_S^+)} \quad (22)$$

When ø=0 and $\bar{ø}$=1, $$G_2(s) = \frac{-1}{sR(C_C - kC_S^-)} \quad (23)$$

It is necessary that $C_C$>$kC_S^+$ and $C_C$>$kC_S^-$ for the circuit of FIG. 4 to operate as the differential capacitance inversion integrator.

Next, the ratio-metric conversion of the embodiment will be explained.

First, the integrator of FIG. 3 or FIG. 4 is assembled into the harmonic oscillation circuit and the relaxation oscillation circuit. The oscillation frequency ($\omega_1$, $\omega_2$) output based on two kinds of the input and output characteristics are measured in a digital signal processing circuit by the switch signals (ø, inversion ø) for each of the analog switches $S_1$, $S_2$, $S_3$ and $S_4$. As the digital signal processing circuit, a frequency/time conversion circuit (FIG. 5) which is described hereinafter is used.

Figure 5:
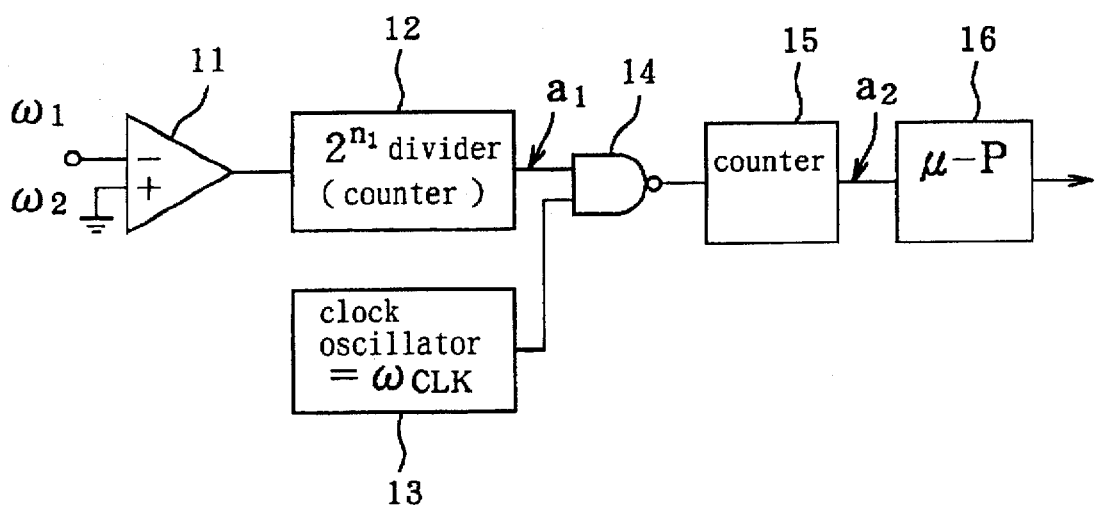
FIG. 5 is a block diagram of the digital signal processing circuit usable for the ratio-metric conversion.

When division is executed in the digital signal processing circuit of FIG. 5, taking one of the two kinds of oscillation outputs ($\omega_1$, $\omega_2$) as numerator and the other as denominator, it is possible to remove error factors such as drift, temperature characteristic or deterioration, dependency on the power source voltage and the like of the circuit constructing elements except the sensor capacitance ($C_S$), the reference capacitance ($C_R$), the second reference capacitance ($C_C$), and the gain (−k) of the inversion amplifier.

FIG. 5 shows the digital signal processing circuit for processing the output from the oscillation circuit. The processing circuit consists of a comparator 11, a frequency divider 12, a clock oscillator 13, a NAND element 14, a counter 15, and a microprocessor 16.

In the circuit, one (+ side) of two input terminals of the comparator 11 is grounded, and a signal of desired frequency ω (=$\omega_1$, $\omega_2$, - - - ) is inputted to the other (− side) of the two input terminals of the comparator 11, and then the signal is digitized by the comparator 11.

The frequency divider 12 is an asynchronous type counter and divides a frequency of the input signal to $½^{n_1}$. For example, in case of $n_1$=8 bits, therefore, $2^{n_1}$=256, the frequency of 10 kHz is divided as 10 kHz×1/256≈39 Hz.

If an output of the frequency divider 12 is $a_1$, frequencies of the output $a_1$ for input signals of the frequencies $\omega_1$ and $\omega_2$ will be $\omega_1'=\omega_1/2^{n_1}$ and $\omega_2'=\omega_2/2^{n_1}$, respectively.

The clock oscillator 13 generates a signal of fixed frequency $\omega_{CLK}$.

The NAND element 14 makes AND of the output $a_1$ of the frequency divider 12 and the output of clock oscillator 13, and then outputs the AND signal. The output of the NAND element 14 becomes a pulse signal of ($\omega_{CLK} \div \omega'$), and the number of pulses is counted by the counter 15.

In other words, if an output of the counter 15 is $a_2$, then values of the output $a_2$ from the counter 15 for the output $a_1$ of frequency $\omega_1'$, $\omega_2'$ from the frequency divider 12 will be count1=$\omega_{CLK}/\omega_1'$, count2=$\omega_{CLK}/\omega_2'$, respectively. Since the clock frequency $\omega_{CLK}$ is much larger than the frequency $\omega'$ of the output $a_1$ of the frequency divider 12 (that is, $\omega_{CLK} >> \omega'$), the output $a_2$ of the counter 15 appears as a large value and the accuracy is improved accordingly.

The micro-processor 16 executes division for these count values. Therefore, an output from the micro-processor 16 is represented as follows:

$$\frac{\text{count1}}{\text{count2}} = \frac{\omega_2'}{\omega_1'} = \frac{\omega_2}{\omega_1} \quad (24)$$

Therefore, the two kinds of the oscillation frequency $\omega_1$ and $\omega_2$ are given with high accuracy, irrelevantly with the clock frequency $\omega_{CLK}$.

From the above, an operation of the circuit of FIG. 5 is described as follows:

1. The oscillation output from the comparator 11 is accumulatively added in the frequency divider 12 (averaging process). The times of this accumulative addition equivalently equal to the times of averaging processing.

2. The oscillation output (the output from the frequency divider 12) accumulatively added in the step 1 is inputted to the NAND element 14, in which a frequency of the input signal is divided by AND operation with the high clock frequency signal from the clock oscillator 13, and the frequency is counted in the counter 15. This operating process equivalently and accumulatively adds the oscillation frequency, and divides the time of one period of the oscillation by the time of one period of the high speed clock.

3. A result of the step 2 (the output of the counter 15) is the ratio-metric conversion which makes a ratio of frequency as above by the dividing process in the microprocessor 16.

The detector of difference of capacitance (amount of change of capacitance) employing the differential capacitance inversion integrator of FIG. 1 can be used in a large number of circuits and systems.

As examples, constructions of the above-mentioned harmonic oscillation circuit and the above-mentioned relaxation oscillation circuit are explained below.

Figure 6:
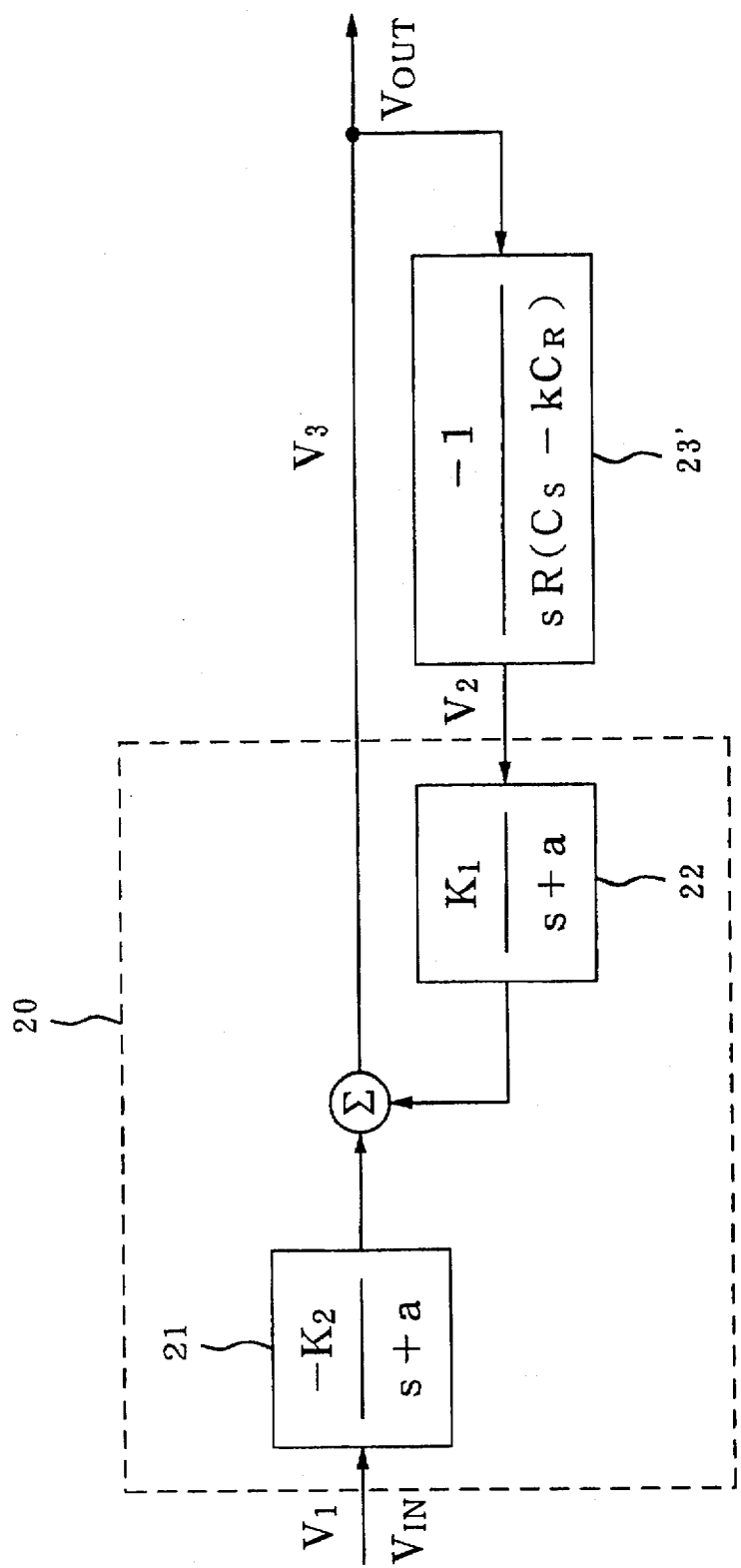
FIG. 6 is a block diagram of the state variable type band-pass filter circuit employing the differential capacitance inversion integrator of FIG. 1.

(1) Harmonic oscillation circuit:

FIG. 6 shows the state variable type band-pass filter circuit employing the differential capacitance inversion integrator of FIG. 1.

Figure 13:
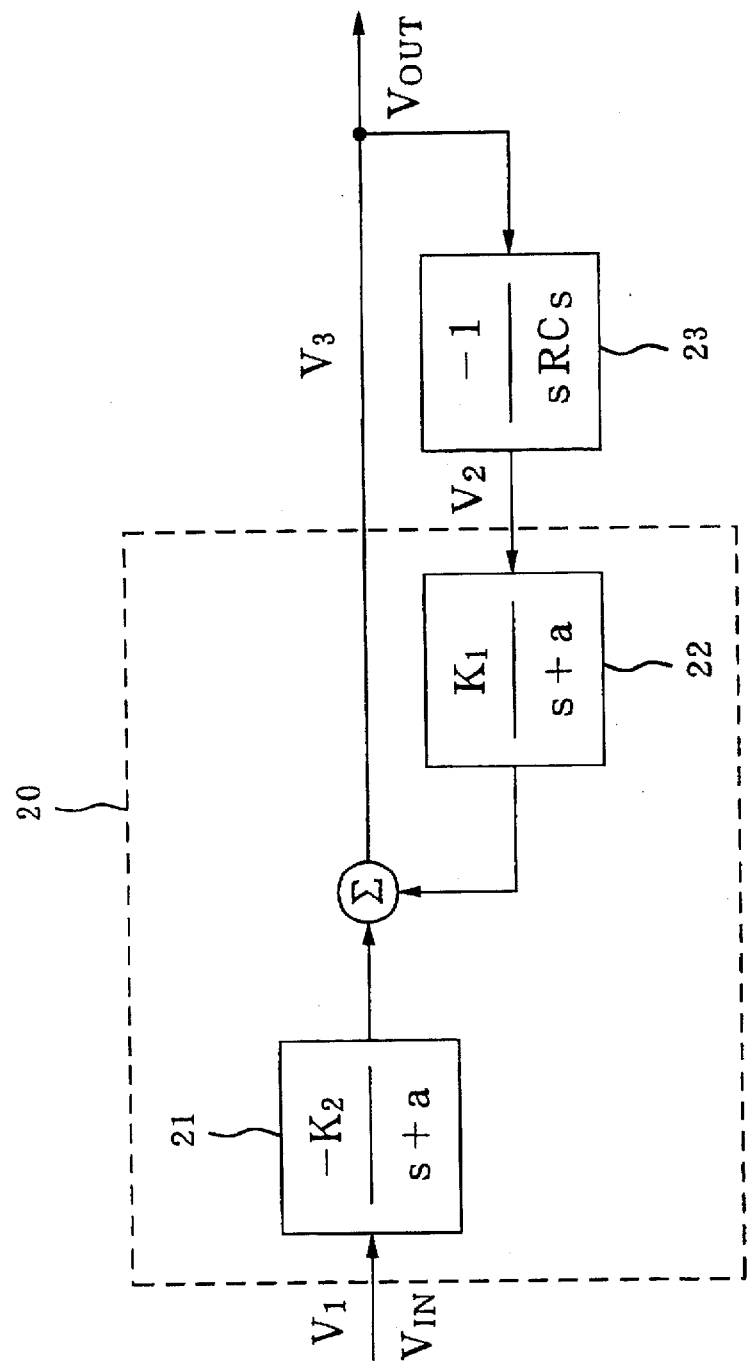
FIG. 13 is a block diagram of the conventional state variable type band-pass filter circuit.
Figure 14:
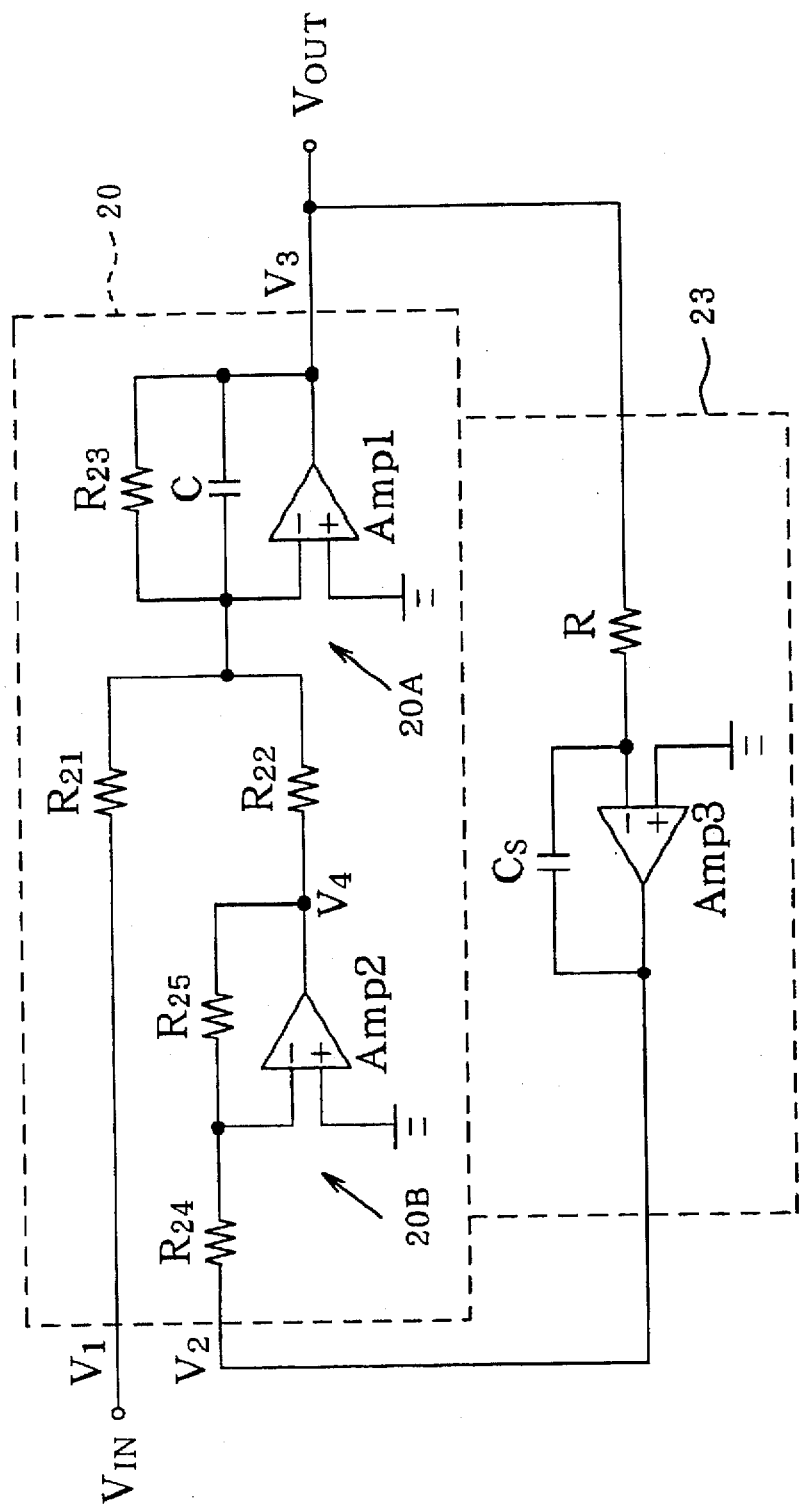
FIG. 14 shows a typical example of the harmonic oscillation circuit which is constructed by connecting an output $V_{OUT}$ to an input $V_{IN}$ in FIG. 13.

If an output $V_{OUT}$ of the circuit is connected to an input $V_{IN}$, then the circuit is a harmonic oscillation circuit, in which the integrator 23 in the above-mentioned band-pass filter circuit (FIG. 13) is replaced by the differential capacitance inversion integrator of FIG. 1 to be a new integrator 23'.

Figure 7:
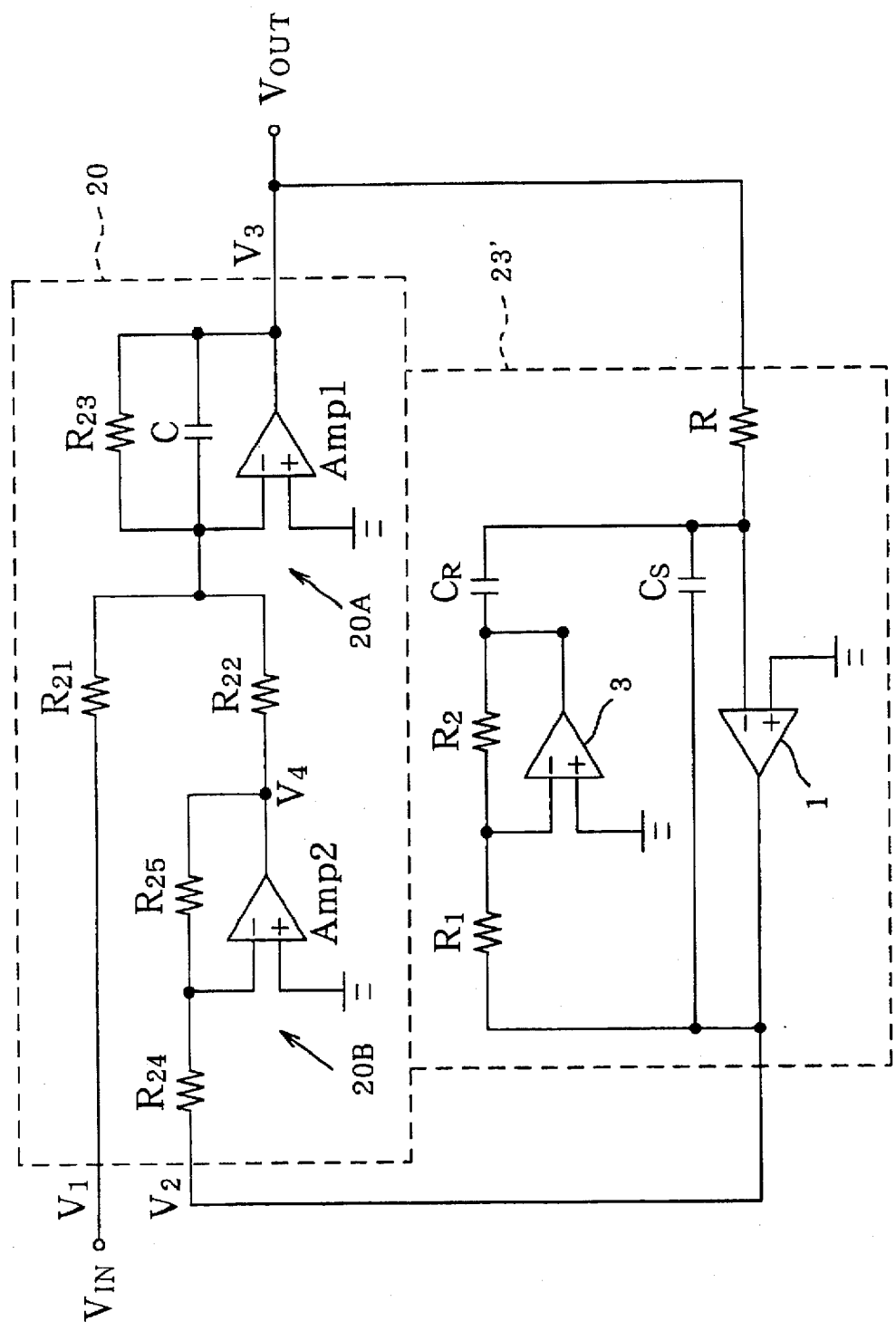
FIG. 7 shows an example of the harmonic oscillation circuit which is constructed by connecting an output $V_{OUT}$ to an input $V_{IN}$ in FIG. 6.

FIG. 7 shows an example of the harmonic oscillation circuit which is constructed by connecting an output $V_{OUT}$ to an input $V_{IN}$ in FIG. 6. In FIG. 7, the block 23' includes an integrator having a resistance R, two capacitances $C_S$, $C_R$, and an operational amplifier 1 as shown in FIG. 1, and further includes two resistances $R_1$, $R_2$ and an operational amplifier 3 for constructing the inversion amplifier 2 as shown in FIG. 2.

The oscillation frequency $\omega$ of this harmonic oscillation circuit is given by $$\omega = \sqrt{\frac{K_1}{R(C_S - kC_R)}} \quad (25)$$

Therefore, the oscillation frequency is determined by the difference between the two capacitances.

In the circuit of FIG. 6, if $\Delta C = \alpha C_B$ ($\alpha$: rate of change of capacitance) and $C_B - kC_R = \beta C_B$ ($\beta$: initial capacitive difference), then the rate of change of the oscillation frequency $\omega$ for the amount of change ($\Delta C$) of capacitance is represented as follows:

The rate of change of the oscillation frequency $$= \left( \sqrt{\frac{1}{1 + \frac{\alpha}{\beta}}} - 1 \right) \times 100(\%) \quad (26)$$

From the above equation, the dynamic range can be regulated by a ratio of $\alpha$ to $\beta$.

Next, experimental results will be explained.

Figure 8:
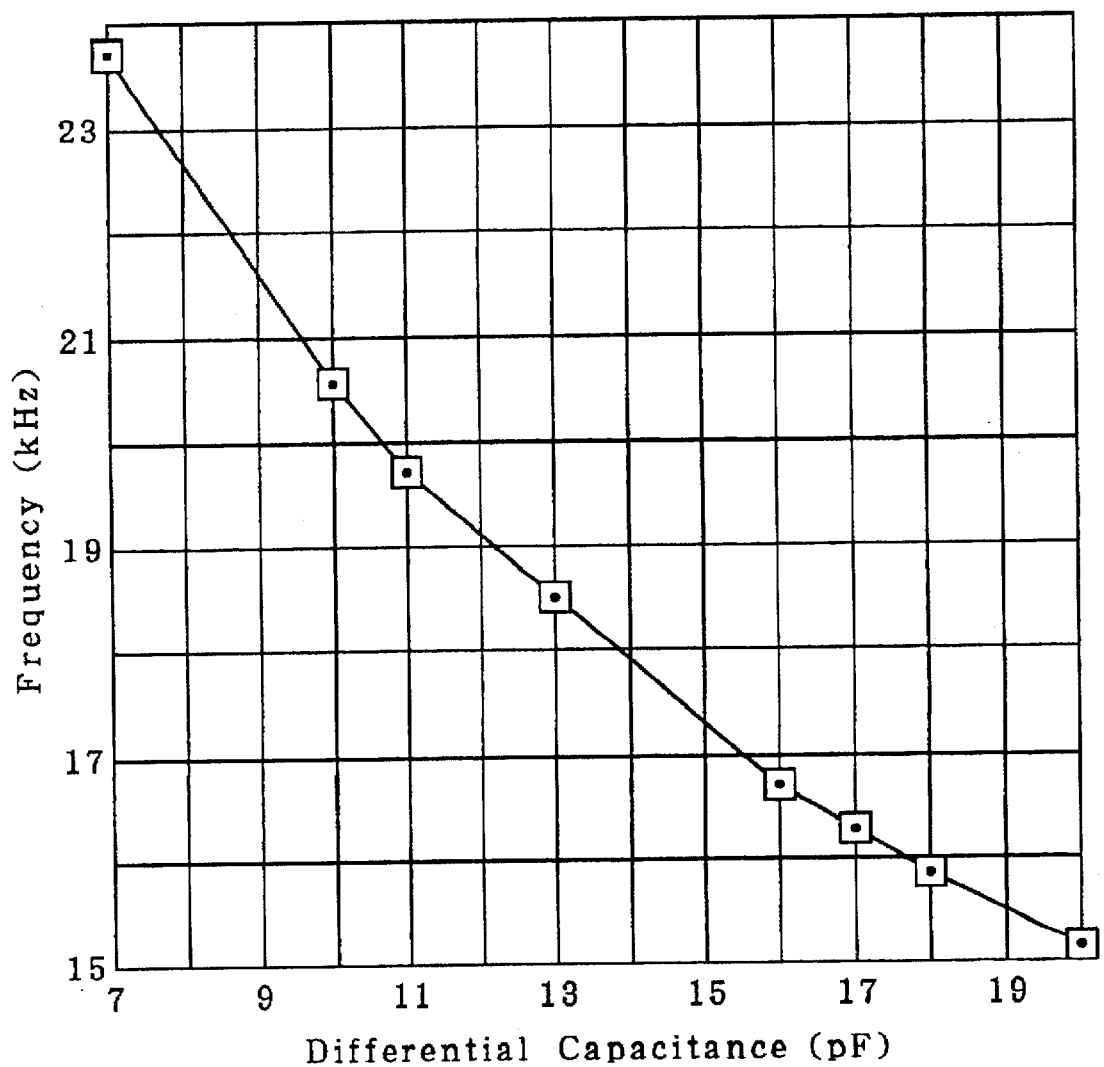
FIG. 8 is a graph showing the relation between the difference of capacitance in the circuit of FIG. 6 and the oscillation frequency.

FIG. 8 shows change of frequency when $C_R$ of the differential capacitance inversion integrator is fixed to 20 pF, and $C_S$ is changed at several points in a region of 27 to 40 pF in the circuit of FIG. 6.

Figure 9:
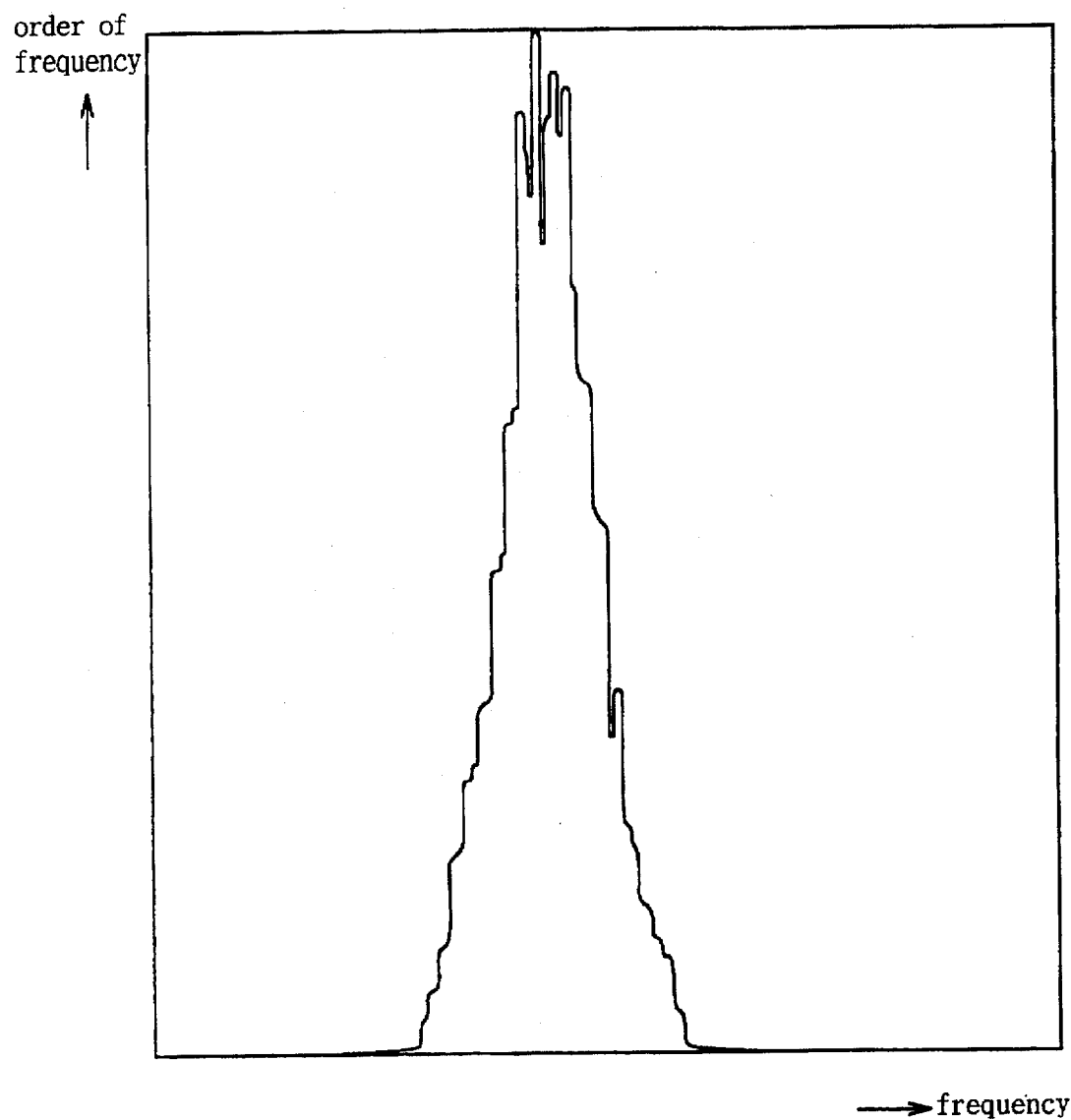
FIG. 9 is a graph showing time distribution of the oscillation frequency in the circuit of FIG. 6.

FIG. 9 is a graph by histogram showing the oscillation frequency measured 1,000 times, when $C_R$ of the differential capacitance inversion integrator is 20 pF and $C_S$ is 27 pF in the circuit of FIG. 6. Since the graph shows a distribution approximating to normal distribution, after the frequency/time conversion, a shake of the oscillation frequency can be made small by a digital filter.

Figure 10:
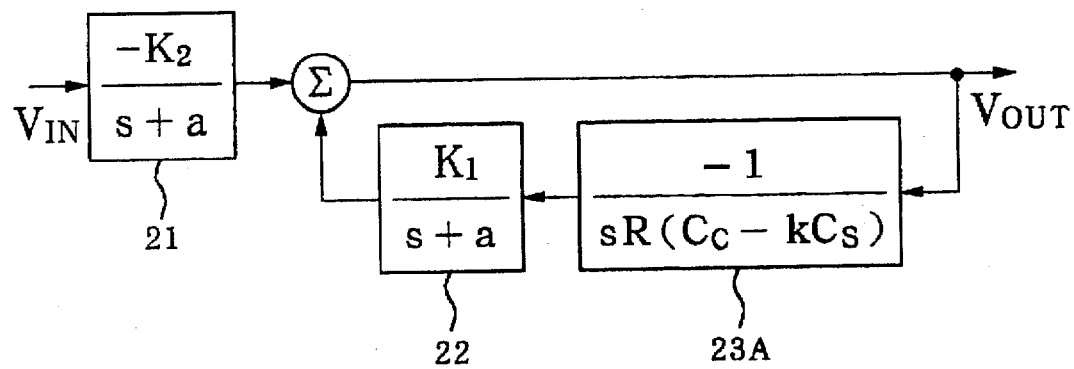
FIG. 10 is a block diagram of the state variable type band-pass filter circuit employing the ratio-metric type differential capacitance inversion integrator.
Figure 10:
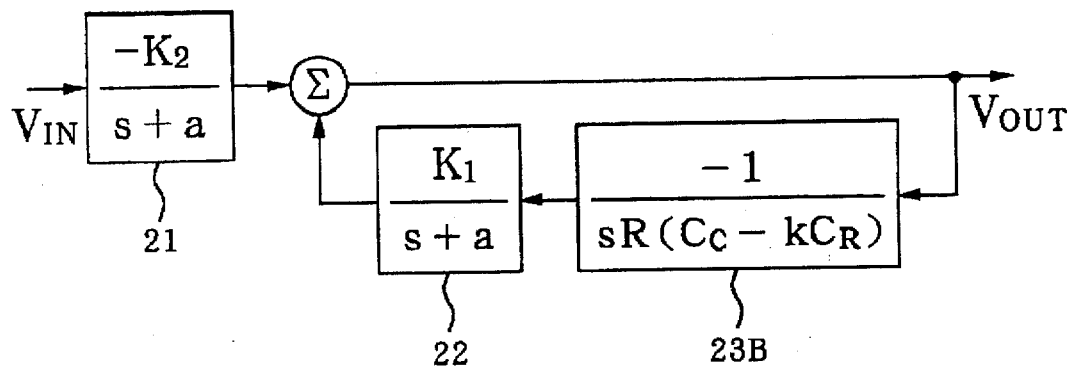

Next, FIG. 10 is a block diagram when the differential capacitance inversion integrator, which constructs the integrator 23' in the state variable type band-pass filter circuit of FIG. 6, is replaced by the ratio-metric type differential capacitance inversion integrator. In this case, the state variable type band-pass filter circuit has integrators 23A and 23B corresponding to two conditions (A) and (B) of control signals of the analog switches.

The result of the digital signal processing in the circuit of FIG. 5, employing the ratio-metric type differential capacitance inversion integrator of FIG. 10, is represented as follows:

When $\phi = 1$ and $\overline{\phi} = 0$, $$\omega_1 = \sqrt{\frac{K_1}{R(C_C - kC_S)}} \quad (27)$$

When $\phi = 0$ and $\overline{\phi} = 1$, $$\omega_2 = \sqrt{\frac{K_1}{R(C_C - kC_R)}} \quad (28)$$

The parameters $K_1$ and R to be factors of drift can be removed by executing the ratio-metric conversion from the above two equations. That is, $$\frac{\omega_1}{\omega_2} = \sqrt{\frac{C_C - kC_R}{C_C - kC_S}} \quad (29)$$

This equation consists of only the sensor capacitance ($C_S$), the reference capacitance ($C_R$), the second reference capacitance ($C_C$), and the gain ($-k$) of the inversion amplifier. That is, it should be noted that the factors except the sensor capacitance ($C_S$), the reference capacitance ($C_R$), the second reference capacitance ($C_C$), and the gain ($-k$) of the inversion amplifier, do not influence.

Moreover, in the case of the differential capacitance variable type sensor, it is represented by $$\frac{\omega_1}{\omega_2} = \sqrt{\frac{C_C - kC_S^+}{C_C - kC_S^-}} \qquad (30)$$

Figure 11:
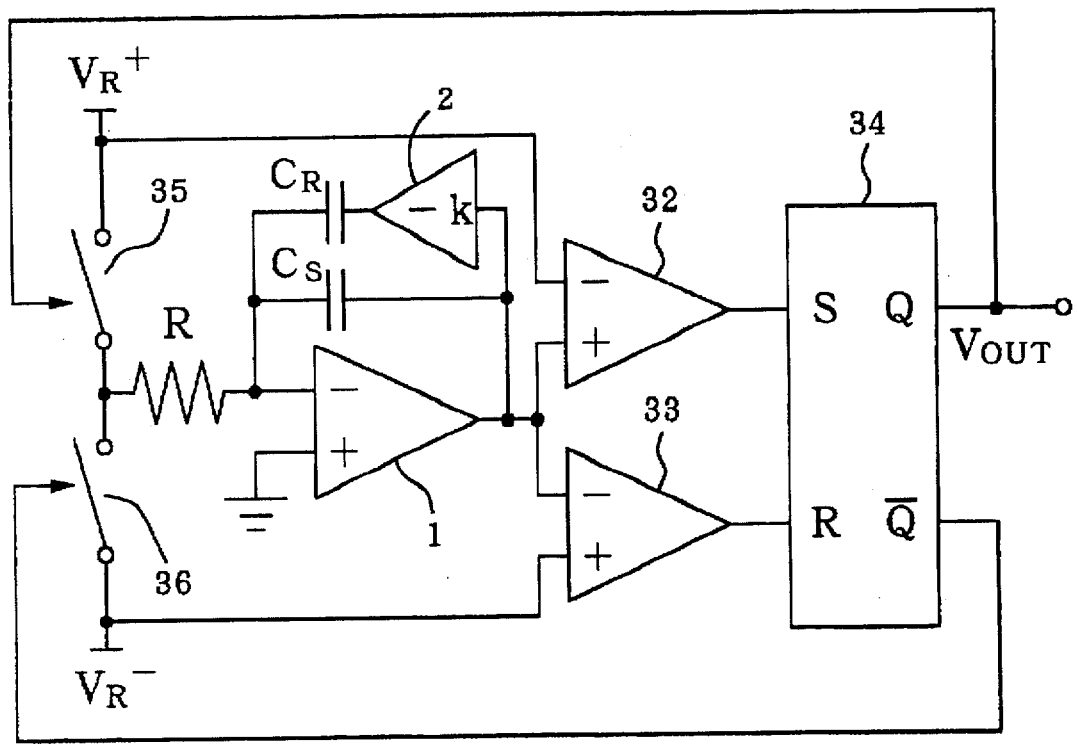
FIG. 11 is a block diagram of the relaxation oscillation circuit employing the differential capacitance inversion integrator of FIG. 1.
Figure 15:
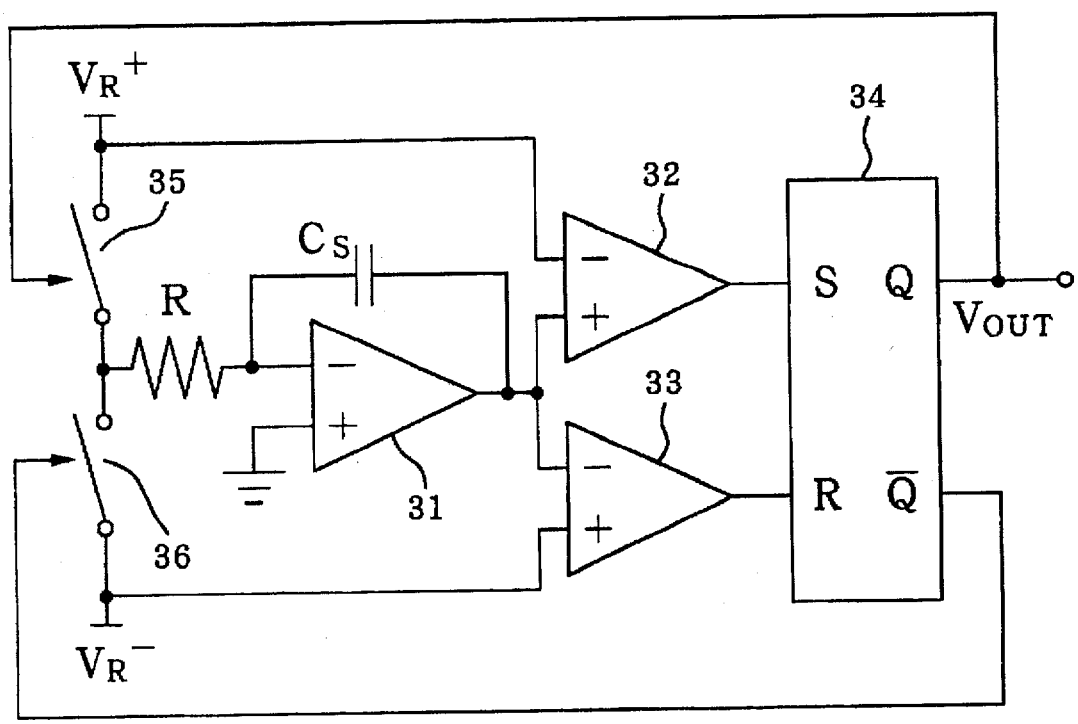
FIG. 15 is a block diagram of the conventional relaxation oscillation circuit.

(2) Relaxation oscillation circuit:

FIG. 11 shows a triangular wave relaxation oscillation circuit employing the differential capacitance inversion integrator of FIG. 1. The circuit is equivalent with the above relaxation oscillation circuit (FIG. 15) which changes the sensor capacitance $C_S$ to ($C_S$–$kC_R$).

The oscillation frequency $\omega$ of this circuit is given by $$\omega = \frac{-2\pi V_R^+ V_R^-}{R \cdot (C_S - kC_R) \cdot (V_R^+ - V_R^-)^2} \qquad (31)$$

Here, if the reference voltage $V_R^+ = -V_R^-$, then $$\omega = \frac{\pi}{2R(C_S - kC_R)} \qquad (32)$$

Therefore, the oscillation frequency is decided by the differential capacitance.

In the circuit of FIG. 11, if $\Delta C = \alpha C_B$ ($\alpha$: rate of change of capacitance) and $C_B - kC_R = \beta C_B$ ($\beta$: initial difference of capacitance), then the rate of change of the oscillation frequency $\omega$ for the amount of change of the capacitance ($\Delta C$) is represented by the following equation:

$$\text{The amount of change of the capacitance} = \left( \frac{1}{1 + \frac{\alpha}{\beta}} - 1 \right) \times 100(\%) \qquad (33)$$

From the above equation, the dynamic range can be regulated by a ratio of $\alpha$ to $\beta$.

Figure 12:
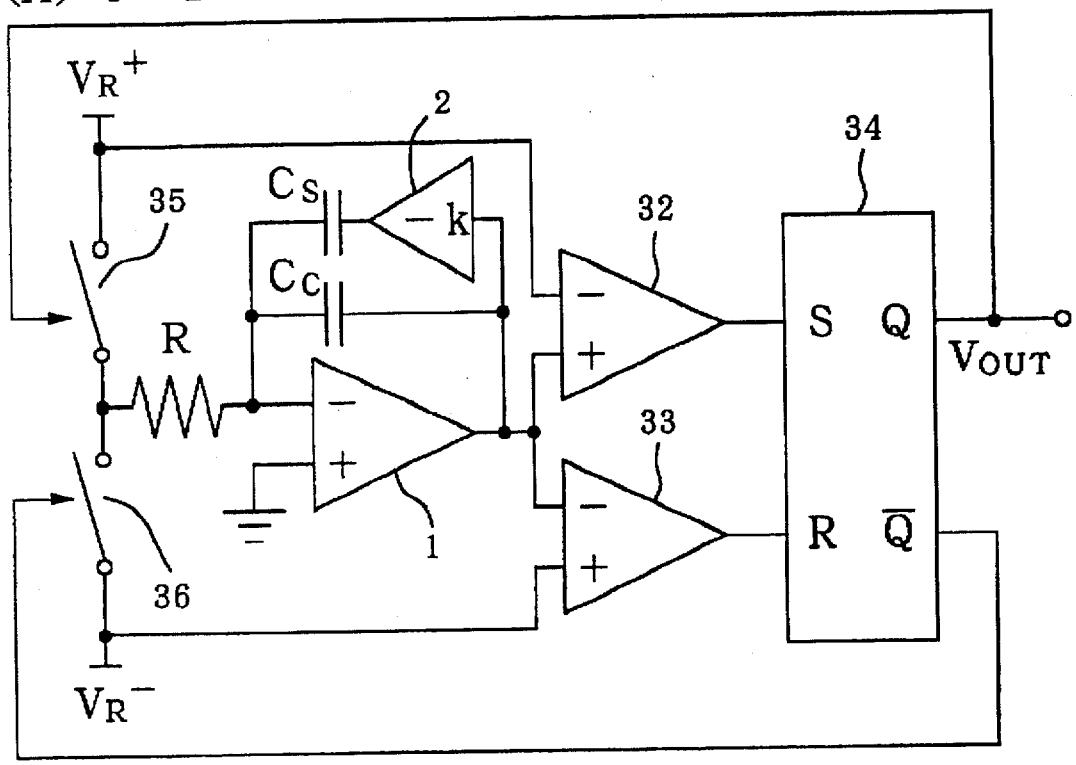
FIG. 12 is a block diagram of the relaxation oscillation circuit employing the ratio-metric type differential capacitance inversion integrator.
Figure 12:
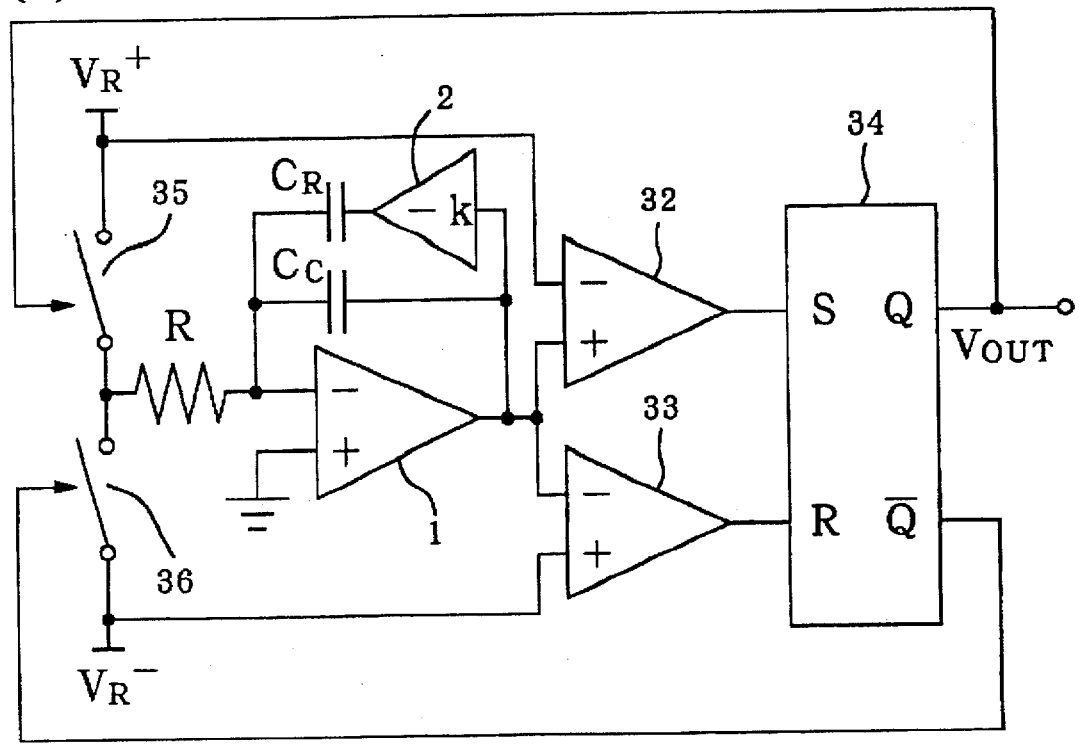

FIG. 12 is a block diagram when the differential capacitance inversion integrator of FIG. 11 is replaced by the ratio-metric type differential capacitance inversion integrator. This figure separately shows two states (A) and (B) of the control signals of the analog switches.

A result of the digital signal processing in the circuit of FIG. 5, employing the ratio-metric type differential capacitance inversion integrator of FIG. 12, is represented as follows:

When $\phi=1$ and $\bar{\phi}=0$, $$\omega_1 = \frac{-2\pi V_R^+ V_R^-}{R(C_C - kC_S)(V_R^+ - V_R^-)^2} \qquad (34)$$

When $\phi=0$ and $\bar{\phi}=1$, $$\omega_2 = \frac{-2\pi V_R^+ V_R^-}{R(C_C - kC_R)(V_R^+ - V_R^-)^2} \qquad (35)$$

If executing the ratio-metric conversion from the above two equations, the result is given by $$\frac{\omega_1}{\omega_2} = \frac{C_C - kC_R}{C_C - kC_S} \qquad (36)$$

Therefore, the equation consists of only the sensor capacitance ($C_S$), the reference capacitance ($C_R$), the second reference capacitance ($C_C$), and the gain ($-k$) of the inversion amplifier. That is, it should be noted that the factors except the sensor capacitance ($C_S$), the reference capacitance ($C_R$), the second reference capacitance ($C_C$), and the gain ($-k$) of the inversion amplifier, do not influence.

As mentioned above, according to this invention, the oscillation frequency is decided by the difference between two capacitances, because of using the differential capacitance inversion integrator. Therefore, even if a change of the sensor capacitance is small, various kinds of physical or chemical quantities can be detected or measured by the change of capacitance with high accuracy and high resolution.

Moreover, by the ratio-metric conversion, in both of the harmonic oscillation circuit and the relaxation oscillation circuit, it is possible to remove error factors such as drift, temperature characteristic or deterioration, dependency on the power source voltage and the like of the circuit construction elements except the sensor capacitance ($C_S$), the reference capacitance ($C_R$), the second reference capacitance ($C_C$), and the gain ($-k$) of the inversion amplifier.

What is claimed is:

1. A differential capacitance inversion integrator comprising:

a first operational amplifier having an inversion input and an output;

a capacitance ($C_S$) connected between said inversion input of said first operational amplifier and said output of said first operational amplifier;

a reference capacitance ($C_R$) having one terminal connected to said inversion input of said first operational amplifier;

an inversion amplifier having an input connected to said output of said first operational amplifier and an output connected to another terminal of said reference capacitance ($C_R$); and a first resistance (R) having one terminal connected to said inversion input of said first operational amplifier;

said differential capacitance inversion integrator having an input at another terminal of said first resistance (R) and an output at said output of said first operational amplifier, wherein said differential capacitance inversion integrator has an integral constant determined by a difference between said capacitance ($C_S$) and said reference capacitance ($C_R$) and by said first resistance (R).

2. The differential capacitance inversion integrator according to claim 1, wherein said inversion amplifier includes:

a second operational amplifier having an inversion input and an output;

a second resistance ($R_1$) having one terminal connected to said inversion input of said second operational amplifier;

a third resistance ($R_2$) connected between said inversion input of said second operational amplifier and said output of said second operational amplifier;

said inversion amplifier having an input at another terminal of said second resistance ($R_1$) and an output having at said output of said second operational amplifier.

3. A differential capacitance detector, including a differential capacitance inversion integrator as an element of an oscillation circuit having an oscillation frequency, comprising in combination:

a first operational amplifier having an inversion input and an output;

a capacitance ($C_S$) of a sensor connected between said inversion input of said first operational amplifier and said output of said first operational amplifier, said capacitance ($C_S$) corresponding to a physical or chemical quantity of an object under detection;

a reference capacitance ($C_R$) having one terminal connected to said inversion input of said first operational amplifier;

an inversion amplifier having an input connected to said output of said first operational amplifier and an output connected to another terminal of said reference capacitance ($C_R$);

a first resistance (R) having one terminal connected to said inversion input of said first operational amplifier;

said differential capacitance inversion integrator having an input at another terminal of said first resistance (R) and an output at said output of said first operational amplifier, wherein said differential capacitance inversion integrator has an integral constant determined by a difference between said capacitance ($C_S$) of the sensor and said reference capacitance ($C_R$) and by said first resistance (R), and said oscillation circuit has an oscillation frequency determined by said integral constant of said differential capacitance inversion integrator.

4. The differential capacitance detector according to claim 3, wherein said inversion amplifier includes:

a second operational amplifier having an inversion input and an output;

a second resistance ($R_1$) having one terminal connected to said inversion input of said second operational amplifier;

a third resistance ($R_2$) connected between said inversion input of said second operational amplifier and said output of said second operational amplifier;

said inversion amplifier having an input at another terminal of said second resistance ($R_1$) and an output having at said output of said second operational amplifier.

5. The differential capacitance detector according to claim 3, wherein said oscillation circuit consists of a harmonic oscillation circuit including said differential capacitance inversion integrator as an integral element.

6. The differential capacitance detector according to claim 3, wherein said oscillation circuit consists of a relaxation oscillation circuit employing said differential capacitance inversion integrator.

7. The differential capacitance detector according to claim 3, wherein said sensor consists of a differential capacitance variable sensor having two capacitances ($C_S+$ and $C_S^-$), one capacitance ($C_S+$) of said capacitances being increased and the other capacitance ($C_S^-$) being decreased when said physical or chemical quantity of said object under detection is detected, and wherein said capacitance ($C_S$) of said sensor is said one capacitance ($C_S+$) of said capacitances and said reference capacitance ($C_R$) is said other capacitance ($C_S^-$).

8. The differential capacitance detector according to claim 3, wherein said differential capacitance inversion integrator includes four analog switches and a differential capacitance variable sensor having two capacitances ($C_S+$ and $C_S^-$), one capacitance ($C_S+$) of said capacitances being increased and the other capacitance ($C_S^-$) being decreased when said physical or chemical quantity of said object under detection is detected;

wherein said one capacitance ($C_S+$) of said capacitances connected to two of said four analog switches, respectively;

said other capacitance ($C_S^-$) is connected to the other two of said four analog switches; and said detector generates two kinds of oscillation outputs from said oscillation circuit according to switch signals to said four analog switches, and divides said two kinds of oscillation outputs in a digital signal processing circuit, and thus detects a ratio of frequency of said oscillation outputs corresponding to said difference between said two capacitances ($C_S+$ and $C_S^-$).

9. The differential capacitance detector according to claim 8: wherein said digital signal processing circuit includes;

a comparator having an input connected to said oscillation circuit and an output;

a frequency divider having an input connected to said output of said comparator and an output;

an oscillator for generating clock pulses;

a gate for gating said output pulses from said oscillator by an output signal from said frequency divider;

a pulse counter for counting output pulses from said gate and for producing count values of said output pulses; and a microprocessor operable to execute division for said count values.

* * * * *